United States Patent [19]

Sergio

[11] Patent Number: 5,417,828
[45] Date of Patent: May 23, 1995

[54] ELECTROPLATING PLANT WITH OPPOSED ELECTROLITIC CELLS AND CONTINUOUS FEED OF THE WORKPIECES TO BE PLATED

[76] Inventor: Sala Sergio, Via Carcassola 64, Trezzo d'Adda (Milano), Italy

[21] Appl. No.: 156,096

[22] Filed: Nov. 22, 1993

[30] Foreign Application Priority Data

Nov. 23, 1992 [IT] Italy ................ MI92A2679

[51] Int. Cl.⁶ ................ C25D 17/28; C25D 21/12
[52] U.S. Cl. ................ 204/202; 204/237; 204/269; 204/275; 204/224 R
[58] Field of Search ........... 204/224 R, 275, 202, 204/269

[56] References Cited

U.S. PATENT DOCUMENTS

| | | | |
|---|---|---|---|
| 4,401,522 | 8/1983 | Buschow et al. | 204/224 R X |
| 4,402,800 | 9/1983 | Ash et al. | 204/224 R X |
| 4,587,000 | 5/1986 | Pellegrino et al. | 204/273 |
| 4,755,271 | 7/1988 | Hosten | 204/202 |
| 4,761,213 | 8/1988 | Hosten | 204/275 X |
| 4,871,435 | 10/1989 | Denofrio | 204/224 R |

FOREIGN PATENT DOCUMENTS 0212253 3/1987 European Pat. Off. .

OTHER PUBLICATIONS

Patent Abstracts Of Japan vol. 11, No. 365, Nov. 1987 and JP A 62 136 588, Jun. 1987.

*Primary Examiner*—Donald R. Valentine
*Attorney, Agent, or Firm*—Herbert Dubno

[57] ABSTRACT

An electroplating plant for the electrolyte deposition of metals on flat components such as printed circuit boards and the like, oriented parallel to the direction of feed and continuously supplied via a system for the transmission and supply of cathode current to the boards. The apparatus has at least one pair of electrolytic cells. Each of the cells is provided with a feed aperture and the aperture for the outflow of the electrolytic solution supplied continuously by a pump drawing the same from a recovery tank. Each cell is provided with anodes and a passage for regulating the flow the electrolytic solution. Each cell has its outflow aperture located opposite that of another cell in order to provide an empty space through which the board passes; the board to be thus placed in contact with the electrolytic solution.

16 Claims, 3 Drawing Sheets

ELECTROPLATING PLANT WITH OPPOSED ELECTROLITIC CELLS AND CONTINUOUS FEED OF THE WORKPIECES TO BE PLATED

FIELD OF THE INVENTION

My present invention relates to a plant for the electrolytic deposition of metals on flat components such as printed circuit boards and the like with continuous feed of the boards and orientation thereof in a direction parallel to the direction of feed along the plant.

BACKGROUND OF THE INVENTION

There is known in printed-circuit production technology the need to place in electrical connection with one another the conducting paths on opposite sides of a flat panel comprised of an insulating substrate covered on both surfaces with a thin coating of conductive material such as copper.

Such connection is achieved by making holes in the board, which are then internally lined with a layer of conductive material (copper) by electrolytic deposition carried out in suitable electroplating plants, in which there is also performed a further operation which involves covering all the copper conducting surfaces comprising the electric circuit with a further layer of protective material and solder (tin-lead alloy) as may be necessary for the subsequent processing of the printed circuit.

Electroplating apparatus of known type for such purposes has, however, certain disadvantages which substantially limit its production capacity. The apparatus provides for electrolytic solution interception tanks of a static type which do not allow the application of high currents to the anode and cathode in order to obtain high rates of deposition. In addition, feeding of the board is discontinuous and the board itself has to be raised, shifted and lowered in the various treatment tanks by means of suitable handling devices, such movements effectively resulting in corresponding down times which bring about a lengthening of the overall cycle time and ultimately a loss of output.

OBJECT OF THE INVENTION

The object of the invention is an automatic plant for the electrolytic deposition of metals on printed circuit boards which will make it possible to achieve continuous feed of the workpieces through the various treatment tanks and bring about constant movement of the electrolytic solution so as to be able to increase the current supplied to the anode and cathode, with a resulting increase in the rate of deposition of the material.

SUMMARY OF THE INVENTION

Such technical problem is resolved according to this invention by an electroplating plant for the electrolytic deposition of metals on flat components (workpieces) such as printed circuit boards and the like, oriented parallel to the direction of feed and continuously supplied via a system for the transmission and supply of cathode current to the said boards, having at least one pair of electrolytic cells each provided with a feed aperture and an aperture for the outflow of the electrolytic solution supplied continuously via appropriate means for drawing the same from a recovery tank, each cell being provided with anodes and means for regulating the flow of the electrolytic solution, each cell of at least one of such pairs having the relevant outflow aperture located opposite that of the other cell in order to provide an empty space through which the board is passed, the board being thus placed in contact with the electrolytic solution, there being also provided components for intercepting the fall of the solution, capable of bringing about the flow of the solution via holes passing through the board for the metallization thereof.

According to the invention, the electroplating plant provides that the aperture for the supply of the electrolytic solution is connected to a vertical header, the open lower end of which is connected to the solution storage and recovery tank, and additionally that the means for drawing of the solution from the storage tank are comprised of a recirculating pump.

It is furthermore provided that each cell comprises anodes consisting of substantially flat components with throughgoing holes allowing recirculation of the electrolytic solution and inserted through the cell in a vertical direction via corresponding slots, as well as means for regulating the rate of flow in each cell. The flow regulating means can consist of at least one tubular member located in an inclined position and substantially extending from the lower surface to the upper corner of the cell opposite the outflow aperture.

In greater detail, provision is also made for such components intercepting the fall of the solution to be substantially comprised of a crosspiece located horizontally across the solution outflow aperture and provided with an outer edge relative to the cell made with an alternation of projections and recesses so that, once placed opposite the appropriate cells, each projection of one piece is located facing a corresponding recess of the opposed intercepting piece.

A further feature of the plant according to the invention is that such electrolytic cells may be superimposed on one another so that the area of the electrolytic solution outflow aperture is substantially equal in height to the dimension provided for the printed circuit board to be metallized.

BRIEF DESCRIPTION OF THE DRAWING

The above and other objects, features, and advantages will become more readily apparent from the following description, reference being made to the accompanying drawing in which.

Further details and features will become more clearly apparent from the description of an example of implementation of the plant according to the invention, given with reference to the attached set of drawings which show.

SPECIFIC DESCRIPTION

Figure 1:
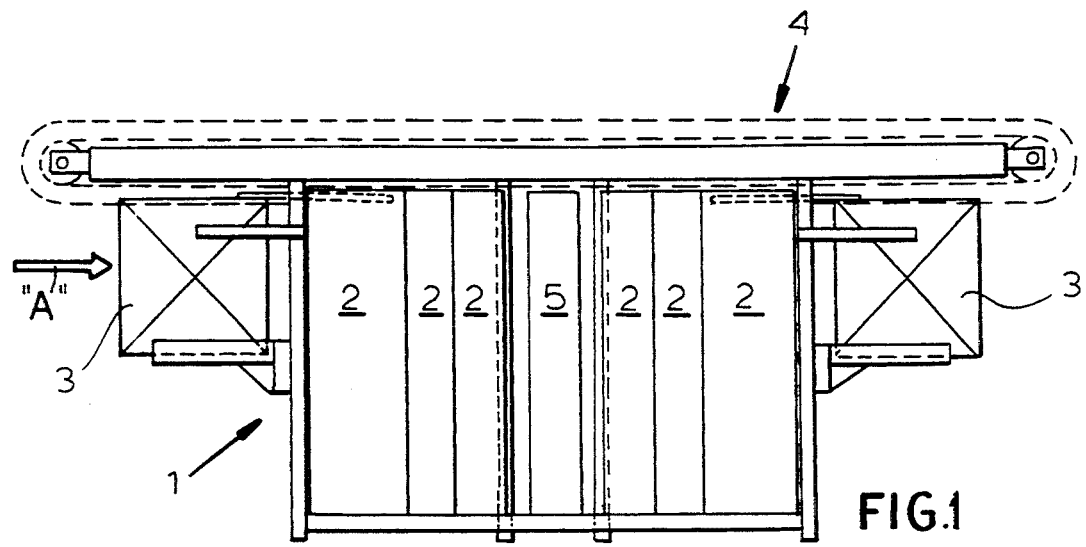
FIG. 1 is a side view of an electroplating plant according to the invention.

As illustrated in FIG. 1, electroplating plant 1 according to the invention is substantially comprised of an assembly of tanks 2 containing the treatment solutions and arranged transversally with respect to direction "A" of feed of boards 3 which are oriented parallel to such direction of feed, which is carried out by means of a closed-loop driving device 4 shown in outline.

At least one of the treatment tanks 2 located along plant 1 consists of a tank 5 of the type designed for the electrolytic deposition of metal and is substantially formed by a bottom container 6 for the storage and recovery of the electrolytic solution. This container is closed at the top by a plate 6a on which are mounted a recirculating pump 7, suction part 7a of which is immersed in the electrolytic solution, and a double series of electrolytic cells 8 arranged one on top of the other in a vertical sense, each series being thus opposed to the other as will become clearer hereinafter.

Figure 4:
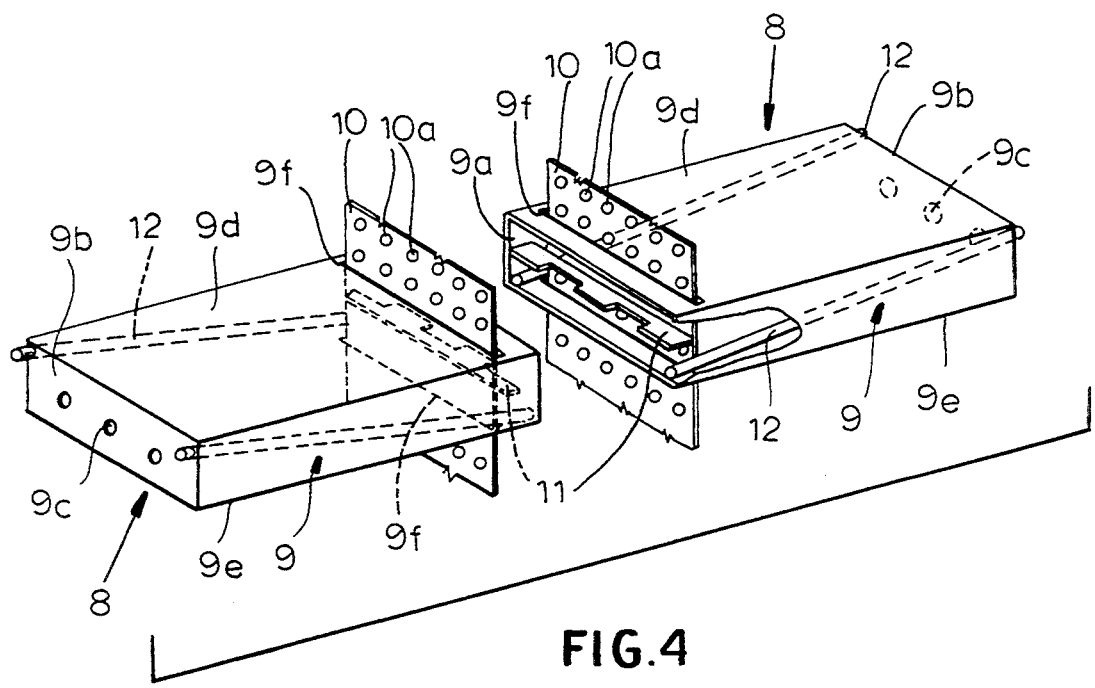
FIG. 4 is a perspective detail view of an electrolytic deposition cell.
Figure 5:
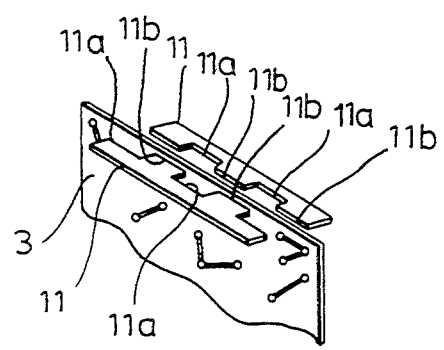
FIG. 5 is a detail perspective view of the components for the vertical interception of the electrolyte.

Each electrolytic cell 8 is substantially in the form of a parallelepiped 9, lower in height with respect to the base dimensions, having an open sidewall 9a and an opposed parallel wall 9b provided with apertures 9c (FIG. 4).

Parallelepiped 9 is also provided with slots 9f respectively located on the surfaces of upper base 9d and lower base 9e; through these opposed and aligned slots is inserted a flat anode 10 provided with through-holes 10a.

Each open wall 9a is then partly obstructed by a component 11 for intercepting the fall of the solution, located horizontally and extending into the cell; the outward-facing edge of such intercepting piece has recesses 11a alternating with projections 11b so that when the two series of cells 8 are face to face each tooth 11b of an intercepting piece 11 is located opposite a corresponding recess 11a in facing intercepting piece 11.

Each cell 8 is then completed by at least one (two in the example illustrated)—tubular member 12 located in an inclined position and extending from lower surface 9e of parallelepiped 9 to the upper rear vertex thereof so as to constitute an overflow outlet capable of maintaining a constant recirculating flow of solution within cell 8 upon variation of outflow orifice 9a of such cell.

Once the vertical series of cells 8 is fitted, each supply aperture 9c is connected with a vertical header 13, a lower aperture 13a of which is immersed in electrolytic solution container 6.

Such connection between aperture 9c and header 13 may also be achieved with the interposition of a flow regulating valve 14 and effected via two coaxial tubes 14a and 14b provided with radial holes 14c, the greater or lesser alignment of which determines the greater or lesser flow of solution.

Figure 3:
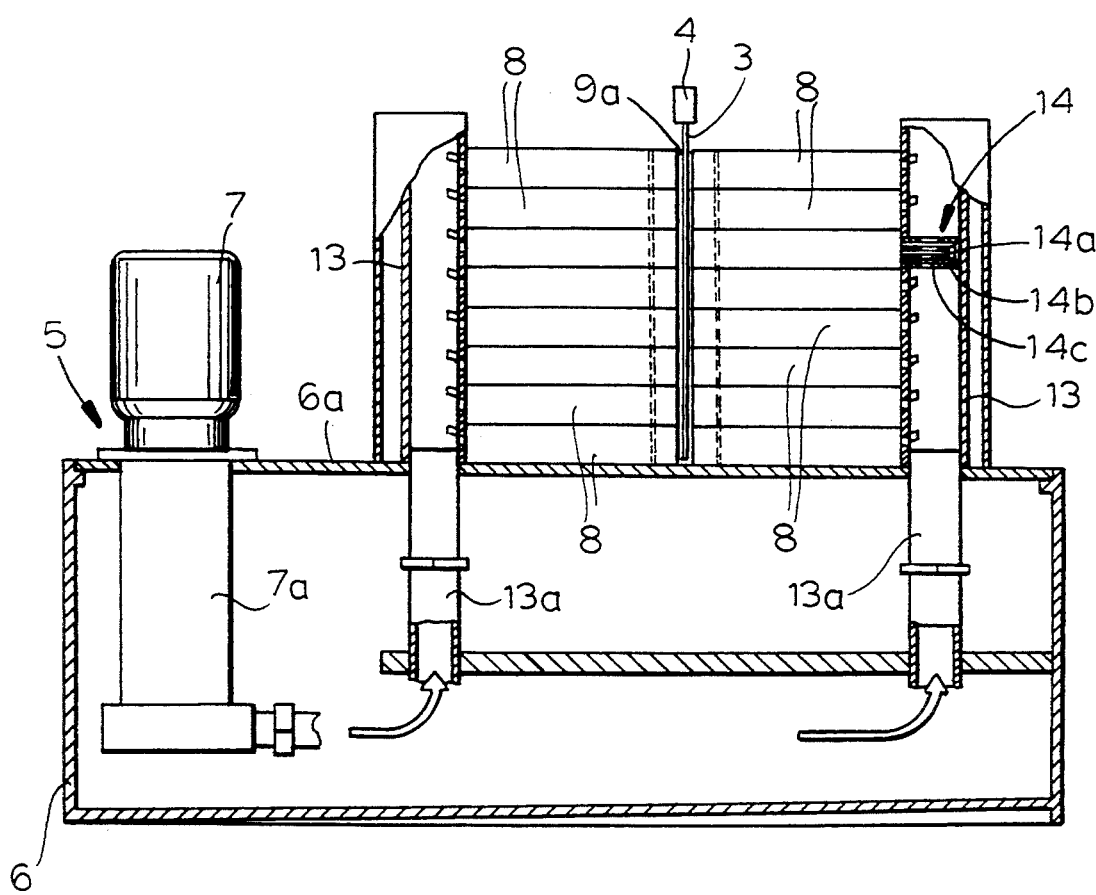
FIG. 3 is a cross-section along line III—III of FIG. 2.

The operation of the plant is as follows:

After placing the two series of cells 8 in opposed position (FIG. 3) on intercepting tank 6, raising to operating level the electrolytic solution within the same and making the electrical connections to anode 10, there is put into operation pump 7 which forces the solution to rise along headers 13, whence it passes through valves 14 into each cell 8 which is filled with electrolytic solution which, after passing through holes 10a of anodes 10, flows out from open walls 9a and falls by gravity in successive cascades toward the bottom, then re-enters tank 6.

Figure 2:
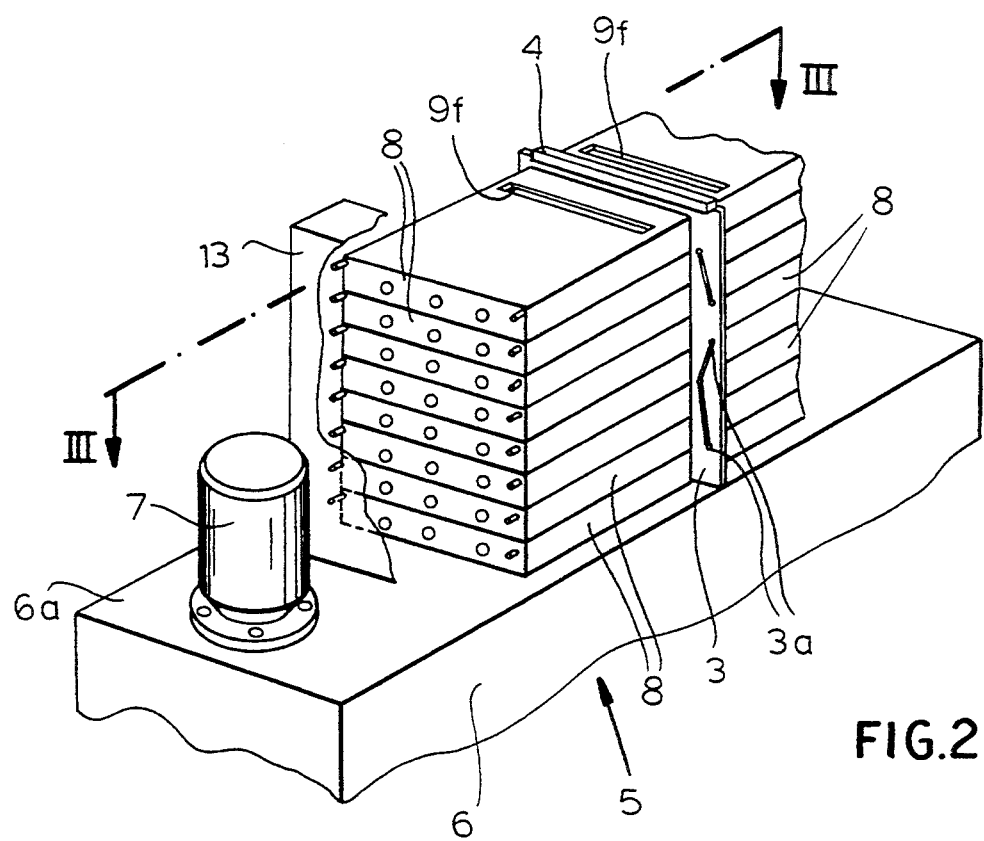
FIG. 2 is a perspective view of an electrolytic treatment tank for the plant.

Simultaneously, handling device 4 grips boards 3, retaining them mechanically and supplying them with cathode current, thus causing them to advance by passing between cells 8; when board 3 (FIG. 2) passes between the two series of opposed cells it determines a greater or lesser occlusion of open walls 9a as a result of its own thickness and of the number and diameter of the holes in the board, which greater or lesser occlusion would bring about an alteration of the rate of recirculation if it were not compensated by tubular members 12 of the overflow, which discharge from the cell more or less solution in proportion to the conditions brought about by the particular type of board inserted.

In this way the cascades of electrolytic solution contact the two surfaces of the board and bring about deposition of the material; furthermore, in flowing over intercepting pieces 11 the solution tends to pass also through holes 3a of printed circuit 3, since the staggered arrangement of projections 11b and recesses 11a determines a prevalence in one sense or in the other which forces the solution to pass through board 3. It should be noted that without such arrangement there would occur a balance of pressures on the two sides of the board which would tend to obstruct the passage of the solution through the holes and prevent metallization thereof.

I claim:

1. An electroplating plant (1) for the electrolytic deposition of metals on flat components such as printed circuit boards (3), oriented parallel to a direction of feed and being continuously supplied via a closed-loop driving device (4) for the transmission and supply of cathode current to said boards (3) characterized in that it has at least one pair of electrolytic cells (8) each one being provided with a feed aperture (9c) and an aperture (9a) for the outflow of the electrolytic solution supplied continuously via appropriate means (7) for drawing the same from a recovery tank (6), each cell being provided with anodes (10) and means (12) for regulating the flow of the electrolytic solution, each cell of at least one of such pairs having the relevant outflow aperture (9a) located opposite that of the other cell in order to provide an empty space through which there is made to pass board (3), which is thus placed in contact with the electrolytic solution, there being also provided components (11) for intercepting the fall of the solution, capable of bringing about the flow of the said solution via holes (3a) passing through board (3) for the metallization thereof, the anodes (10) being comprised of substantially flat components inserted into cell (8) in a vertical sense through corresponding slots (9f) and provided with holes (10a) to allow the passage of the electrolytic solution.

2. An electroplating plant according to claim 1, characterized in that each cell (8) is substantially in the form of a parallelepiped with an open lateral surface to determine aperture (9c) for the outflow of the electrolytic solution.

3. An electroplating plant according to claim 1, characterized in that such aperture (9a) for the supply of the electrolytic solution is connected to a vertical header (13) the open lower end of which is connected to tank (6) for the storage and recovery of the said solution.

4. An electroplating plant according to claim 1, characterized in that such means for drawing the solution from storage tank (6) are comprised of a recirculating pump (7).

5. An electroplating plant according to claim 1, characterized in that such means for regulating the rate of flow of each cell (8) are comprised of at least one tubular component (12) located in an inclined position and substantially extending from the lower surface to the upper corner of the cell opposite outflow aperture (9a).

6. An electroplating plant according to claim 1, characterized in that such intercepting components are substantially comprised of a crosspiece (11) located horizontally across aperture (9a) for the outflow of the solution and provided with an outer edge with respect to the cell made with an alternation of projections (11b) and recesses (11a).

7. An electroplating plant according to claim 1, characterized in that such intercepting components (11) are made in such a way that once they are positioned facing respective cells (8) each projection (11b) of one piece is located in alignment with an appropriate recess (11a) of the opposed intercepting piece.

8. An electroplating plant (1) for the electrolytic deposition of metals on flat components such as printed circuit boards (3), oriented parallel to a direction of feed and being continuously supplied via a closed-loop driving device (4) for the transmission and supply of cathode current to said boards (3) characterized in that it has at least one pair of electrolytic cells (8) each one being provided with a feed aperture (9c) and an aperture (9a) for the outflow of the electrolytic solution supplied continuously via appropriate means (7) for drawing the same from a recovery tank (6), each cell being provided with anodes (10) and means (12) for regulating the flow of the electrolytic solution, each cell of at least one of such pairs having the relevant outflow aperture (9a) located opposite that of the other cell in order to provide an empty space through which there is made to pass board (3), which is thus placed in contact with the electrolytic solution, there being also provided component (11) for intercepting the fall of the solution, capable of bringing about the flow of the said solution via holes (3a) passing through board (3) for the metallization thereof, a plurality of the electrolytic cells (8) being superimposed on one another to determine an area of the electrolytic solution outflow aperture with a height substantially matching a height of a printed circuit board (3) to be metallized.

9. An apparatus for electroplating flat workpieces having throughgoing holes therein, said apparatus comprising:
    transport means for conveying flat workpieces disposed in a vertical plane along a path and parallel to a direction of displacement of the workpieces;
    means for supplying cathode current to said workpieces;
    two stacks each of a plurality of superposed electrolytic cells flanking said path, each of said cells having a feed aperture for receiving an electrolyte, an outlet aperture opening toward said path and workpieces toward displaced therealong, whereby cells of the two stacks have respective outlet apertures opening toward one another, and means for regulating a flow of the electrolyte through the respective cell, the number of cells in each stack determining a height of outlet apertures of each stack juxtaposed with the workpieces and corresponding substantially to the height thereof;
    respective anodes in said cells;
    means at said outlet apertures for intercepting falling electrolyte and directing falling electrolyte through said throughgoing holes;
    a recovery tanks for collecting electrolyte falling from said outlet apertures; and
    means for drawing electrolyte from said tank and feeding said electrolyte to said feed apertures of said cells of said stack whereby said electrolyte from said outlet apertures contacts opposite sides of the workpieces.

10. The apparatus defined in claim 9 wherein each of said cells has a configuration of a parallelepiped open along a side thereof forming the respective outlet aperture.

11. The apparatus defined in claim 9 wherein each of the feed apertures of a respective stack is connected to a respective vertical header having a lower end connected to said tank.

12. The apparatus defined in claim 9 wherein said means for drawing electrolyte from said tank and feeding said electrolyte to said feed apertures of said cells is a recirculating pump.

13. The apparatus defined in claim 9 wherein said anodes are flat plates inserted into the respective cells vertically through corresponding slots and are provided with holes allowing passage of the electrolyte therethrough.

14. The apparatus defined in claim 9 wherein said means for regulating a flow of the electrolyte through the respective cell includes a tube extending from a lower surface of the respective cell at said outlet aperture thereof to an upper corner of the respective cell at an opposite side thereof.

15. The apparatus defined in claim 9 wherein said means at said outlet apertures for intercepting falling electrolyte and directing falling electrolyte through said throughgoing holes are comprised of crosspieces fitting horizontally in said inlet apertures and formed along edges turned toward said path with alternating projections and recesses.

16. The apparatus defined in claim 15 wherein the projections of a crosspiece of a cell on one side of said path are opposite recesses of a crosspiece of a cell on an opposite side of said path.

* * * * *

UNITED STATES PATENT AND TRADEMARK OFFICE
CERTIFICATE OF CORRECTION

PATENT NO. : 5,417,828
DATED : May 23, 1995
INVENTOR(S) : Sergio Sala

It is certified that error appears in the above-indentified patent and that said Letters Patent is hereby corrected as shown below:

On the title page, item [76] inventor's name should read ––Sergio Sala–– below item [19] should read ––Sala––.

Signed and Sealed this

Fifth Day of September, 1995

Attest:

BRUCE LEHMAN

*Attesting Officer*     *Commissioner of Patents and Trademarks*